United States Patent
Tsujita et al.

(10) Patent No.: US 9,297,958 B2
(45) Date of Patent: Mar. 29, 2016

(54) OPTO-ELECTRIC HYBRID BOARD AND METHOD OF MANUFACTURING SAME

(71) Applicant: NITTO DENKO CORPORATION, Ibaraki-shi, Osaka (JP)

(72) Inventors: Yuichi Tsujita, Ibaraki (JP); Toshikazu Baba, Ibaraki (JP); Shotaro Masuda, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 231 days.

(21) Appl. No.: 14/045,353

(22) Filed: Oct. 3, 2013

(65) Prior Publication Data
US 2014/0147076 A1      May 29, 2014

(30) Foreign Application Priority Data
Nov. 27, 2012 (JP) .................. 2012-259048

(51) Int. Cl.
| G02B 6/12 | (2006.01) |
| G02B 6/10 | (2006.01) |
| G03F 7/00 | (2006.01) |
| G02B 6/13 | (2006.01) |
| H05K 1/02 | (2006.01) |
| G02B 6/43 | (2006.01) |

(52) U.S. Cl.
CPC ................. *G02B 6/13* (2013.01); *H05K 1/0274* (2013.01); *G02B 6/43* (2013.01)

(58) Field of Classification Search
CPC ........ G02B 6/12; G02B 6/12004; G02B 6/13; G02B 6/136; G02B 6/43; H05K 1/0274; H05K 1/0275
USPC ............................. 385/14, 129–132; 430/319
See application file for complete search history.

(56) References Cited

U.S. PATENT DOCUMENTS

2009/0269704 A1* 10/2009 Hodono .................. G02B 6/13
                                                                430/319

FOREIGN PATENT DOCUMENTS

| EP | 1 967 876 A1 | 9/2008 |
| EP | 2 112 534 A1 | 10/2009 |

(Continued)

OTHER PUBLICATIONS

Extended European Search Report dated Apr. 4, 2014, issued in corresponding European application No. 13189697.9 (5 pages).

*Primary Examiner* — Akm Enayet Ullah
*Assistant Examiner* — Michael Mooney
(74) *Attorney, Agent, or Firm* — Westerman, Hattori, Daniels & Adrian, LLP

(57) ABSTRACT

An opto-electric hybrid board includes: an electric circuit board including an insulative layer, and an element mounting electrode formed on the front surface of the insulative layer; an optical element mounted on the element mounting electrode by contact frictional heat; and an optical waveguide including a first cladding layer in contact with the back surface of the insulative layer of the electric circuit board. Between the insulative layer and the first cladding layer, a reinforcing layer is provided at the portion corresponding to the element mounting electrode. A reinforcing layer is provided at the portion corresponding to the element mounting electrode, in the surface of the first cladding layer, which is on the side opposite to the insulative layer. The resin-made reinforcing layer is greater than the first cladding layer in storage modulus at the temperature of the board when the element is being mounted.

4 Claims, 10 Drawing Sheets

(56) References Cited

FOREIGN PATENT DOCUMENTS

| | | | |
|---|---|---|---|
| JP | 2009-265342 A | 11/2009 | |
| JP | 2010-286674 | * 12/2010 | ............. G02B 6/122 |
| JP | 2010-286674 A | 12/2010 | |
| JP | 2011-017993 A | 1/2011 | |
| JP | 2011-048150 A | 3/2011 | |
| WO | 2010/110496 A2 | 9/2010 | |

* cited by examiner

RELATED ART

OPTO-ELECTRIC HYBRID BOARD AND METHOD OF MANUFACTURING SAME

BACKGROUND OF THE INVENTION

1. Field of the Invention

The present invention relates to an opto-electric hybrid board being a laminate made up of an electric circuit board having an element such as an optical element mounted and an optical waveguide, and to a method of manufacturing the same.

2. Description of the Related Art

In recent electronic devices and the like, optical interconnection in addition to electrical interconnection has been used so as to address an increase in the amount of transmission information. An exemplary technique may be an opto-electric hybrid board as shown in FIG. 18 (for example, see Japanese Laid-open Patent Application Publication No. 2011-048150). The opto-electric hybrid board includes: a flexible circuit board $E_0$ including a flexible board 51 provided with an electrical interconnect line 52 on its front surface; and an optical waveguide (optical interconnection) $W_0$ (including an under cladding layer 56, a core 57 and an over cladding layer 58) made of epoxy resin or the like, the optical waveguide $W_0$ being stacked on the back surface (the surface opposite to the surface where the electrical interconnect line 52 is formed) of the flexible board 51. An optical element 4 is mounted on the flexible circuit board $E_0$. Owing to the small thickness of both the flexible circuit board $E_0$ and the optical waveguide $W_0$, the opto-electric hybrid board is flexible. Therefore, dealing with the recent trend toward miniaturization of the electronic devices and the like, the opto-electric hybrid board is suitable for use in a small space as being bent, or in a movable section such as a hinge.

However, because of the flexibility, when the optical element 4 is mounted on the flexible circuit board $E_0$, both the flexible circuit board $E_0$ and the optical waveguide $W_0$ deform under the pressure load caused by the mounting work. Accordingly, accurate mounting is difficult to be achieved, i.e., mounting workability is poor.

On the other hand, another disclosed opto-electric hybrid board further includes, as shown in FIG. 19, a stainless steel layer $M_0$ formed across the entire opto-electric hybrid board between the flexible circuit board $E_0$ and the optical waveguide $W_0$ (for example, see Japanese Laid-open Patent Application Publication No. 2009-265342). The opto-electric hybrid board exhibits excellent mounting workability with the optical element 4 since the stainless steel layer $M_0$ functions as reinforcement to suppress deformation under the pressure load caused by the mounting work with the optical element 4.

However, since the stainless steel layer $M_0$ is provided across the entire opto-electric hybrid board, the opto-electric hybrid board lacks flexibility. Therefore, the opto-electric hybrid board is not suitable for use in a small space as being bent, or for use in a movable section such as a hinge.

Accordingly, what is also disclosed is an opto-electric hybrid board in which part of the over cladding layer of the optical waveguide is increased in thickness. The part corresponds to the mounting position of the optical element 4 where flexibility is not required (for example, see Japanese Laid-open Patent Application Publication Nos. 2010-286674 and 2011-017993). With the opto-electric hybrid board, numerous dummy cores not used for optical communication are formed in the region on the front surface of the under cladding layer, which region corresponds to the part of the over cladding layer to be increased in thickness. Thus, the part of the over cladding layer covering the dummy core region becomes thick. This thickness suppresses deformation under the pressure load caused by the mounting work of the optical element 4, thereby improving mounting workability with the optical element. However, such practice invites the following problem in manufacturing.

Generally, an element such as the optical element 4 is mounted on the opto-electric hybrid board by the ultrasonic mounting process. The ultrasonic mounting process is performed as follows. In a state where the opto-electric hybrid board is placed on a stage S with the optical waveguide $W_0$ being on the bottom side as shown in FIG. 20, the optical element 4 attached to the tip of a nozzle N is pressed from above against electrodes 52a formed at the front surface of the flexible circuit board $E_0$ which is on the top side, and vibrated at the ultrasonic frequency in the direction being parallel (see arrow X in FIG. 20) to the plane being perpendicular to the pressing direction (see arrow Z in FIG. 20). Thus, the electrodes 52a of the flexible circuit board $E_0$ and gold bumps (not shown) formed on the surface of electrodes 4a of the optical element 4 are rubbed against each other, such that the electrodes 52a of the flexible circuit board $E_0$ and the gold bumps of the optical element 4 are fused by the frictional heat to be joined to each other.

However, though both the conventional opto-electric hybrid boards, i.e., the one including the stainless steel layer $M_0$ between the flexible circuit board $E_0$ and the optical waveguide $W_0$ (Japanese Laid-open Patent Application Publication No. 2009-265342) and the other one in which the over cladding layer is thickly formed at the part corresponding to the portion where the optical element 4 is mounted (Japanese Laid-open Patent Application Publication Nos. 2010-286674 and 2011-017993), can suppress deformation of the opto-electric hybrid board attributed to the load pressing the optical element 4, the optical waveguide $W_0$ being in contact with the stage vibrates in accordance with the ultrasonic vibrations and hence deforms (see the dashed-two dotted line in FIG. 20). Thus, friction between the electrodes 52a of the flexible circuit board $E_0$ and the gold bumps of the optical element 4 becomes insufficient to generate full frictional heat, making it difficult for the electrodes 52a of the flexible circuit board $E_0$ and the gold bumps of the optical element 4 to join to each other. In particular, since those with a great thickness (Japanese Laid-open Patent Application Publication Nos. 2010-286674 and 2011-017993) tend to easily deform by the ultrasonic vibrations, it is more difficult to achieve joining.

SUMMARY OF THE INVENTION

An opto-electric hybrid board is provided which exhibits excellent flexibility as well as mounting workability with an element such as an optical element by the ultrasonic mounting process, and a method of manufacturing the same.

A first aspect of an opto-electric hybrid board, including:

an electric circuit board including an insulative layer having front and back surfaces, and an element mounting electrode formed at a predetermined position on the front surface of the insulative layer;

an element being in contact with the element mounting electrode, the element being mounted through use of contact frictional heat generated by being in contact with the element mounting electrode;

an optical waveguide including a cladding layer and a core patterned on the cladding layer, the electric circuit board and the optical waveguide being stacked together in a state where the cladding layer is in contact with the back surface of the insulative layer;

a metal-made reinforcing layer formed between the insulative layer and the cladding layer at a portion corresponding to the element mounting electrode; and a resin-made reinforcing layer formed at a portion corresponding to the element mounting electrode, in the cladding layer where the core is formed, wherein the resin-made reinforcing layer is greater than the cladding layer in storage modulus at a temperature of the opto-electric hybrid board when the element is being mounted.

Further, a second aspect provides a method of manufacturing an opto-electric hybrid board, including:

forming an insulative layer on a front surface of a metal layer, thereafter forming an element mounting electrode on a front surface of the insulative layer, thereby forming an electric circuit board on the front surface of the metal layer;

forming a cladding layer on a back surface of the metal layer, thereafter forming a core on the cladding layer, thereby forming an optical waveguide on the back surface of the metal layer; and bringing an element into frictional contact with the element mounting electrode to generate frictional heat, the element being mounted on the element mounting electrode through use of the frictional heat, the method further comprising, prior to the forming of the cladding layer:

in order to leave a portion of the metal layer corresponding to the element mounting electrode, removing the metal layer other than the portion by etching, thereby forming the left portion into a metal-made reinforcing layer;

forming the cladding layer at a portion where the metal layer is removed, with the metal-made reinforcing layer being covered; and forming a resin-made reinforcing layer at a portion corresponding to the element mounting electrode in the cladding layer, wherein the resin-made reinforcing layer is greater than the cladding layer in storage modulus at a temperature of the opto-electric hybrid board when the element is being mounted.

Note that, "the temperature of the opto-electric hybrid board when the element is being mounted" refers to the temperature of the stage where the laminate made up of the electric circuit board, the metal layer and the optical waveguide (i.e., the opto-electric hybrid board excluding the element) is placed when the element is being mounted. Since the laminate is closely attached to the stage when the element is being mounted, the entire laminate achieves the temperature identical to that of the stage.

The opto-electric hybrid board exhibits excellent flexibility, because the metal-made reinforcing layer and the resin-made reinforcing layer are formed not across the entire opto-electric hybrid board but at the portion corresponding to each element mounting electrode. Thus, the opto-electric hybrid board can be deformed, whereby versatility of the opto-electric hybrid board is enhanced. Further, since the metal-made reinforcing layer is formed between the electric circuit board and the optical waveguide, deformation under the pressure load caused by the mounting work of an element such as an optical element on the element mounting electrodes is suppressed. Furthermore, the resin-made reinforcing layer is provided at the core formed surface of the cladding layer, and the resin-made reinforcing layer is set to be greater than the cladding layer in the storage modulus at the temperature of the opto-electric hybrid board when the element is being mounted. Accordingly, when the element is being mounted on the element mounting electrodes by the ultrasonic mounting process, any deformation of the optical waveguide that may be caused by ultrasonic vibrations is suppressed. Thus, the element mounting electrodes and the electrodes of the element can be fully rubbed against each other, whereby full frictional heat can be generated. As a result, both of the electrodes are properly fused, whereby they are properly joined to each other. That is, the opto-electric hybrid board also exhibits excellent element mounting workability in the ultrasonic mounting process, owing to the synergetic effect of the metal-made reinforcing layer and the resin-made reinforcing layer.

In particular, when the core and the resin-made reinforcing layer are made of an identical photosensitive resin, the core and the resin-made reinforcing layer are formed on an identical surface of the cladding layer. Accordingly, the core and the resin-made reinforcing layer can be formed at the same time, whereby excellent productivity is exhibited.

In the method of manufacturing the opto-electric hybrid board, prior to forming the cladding layer, in order to leave a portion of the metal layer corresponding to each element mounting electrode, the metal layer other than such a portion is removed by etching. Further, the resin-made reinforcing layer is formed at a portion corresponding to each element mounting electrode in the cladding layer. The resin-made reinforcing layer is greater than the cladding layer in storage modulus at the temperature of the opto-electric hybrid board when the element is being mounted. Accordingly, the opto-electric hybrid board as described above, i.e., being excellent both in flexibility and in the element mounting workability in the ultrasonic mounting process, can be obtained.

In particular, when the resin-made reinforcing layer is made of a photosensitive resin layer formed on the cladding layer, and the resin-made reinforcing layer is formed simultaneously with the core by the photolithographic process, high productivity is achieved owing to such simultaneous production.

DETAILED DESCRIPTION OF THE INVENTION

Preferred embodiments of the present invention will now be described in detail with reference to the drawings.

Figure 1A:
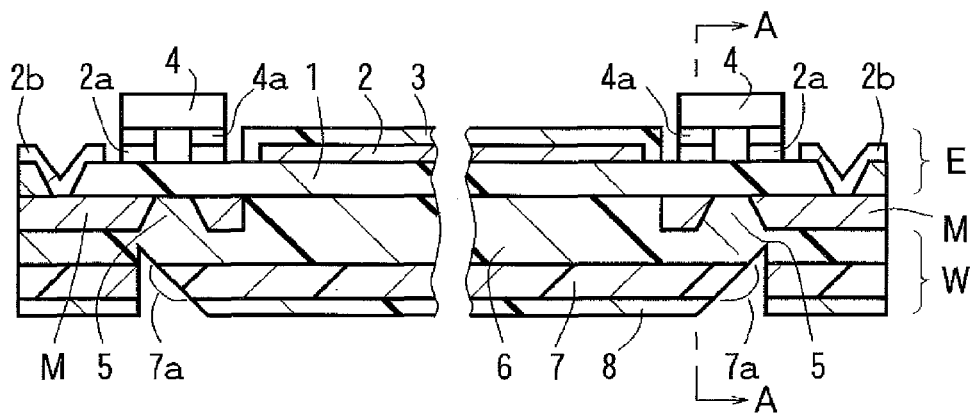
FIG. 1A is a longitudinal sectional view schematically showing an opto-electric hybrid board according to a first preferred embodiment.
Figure 1B:
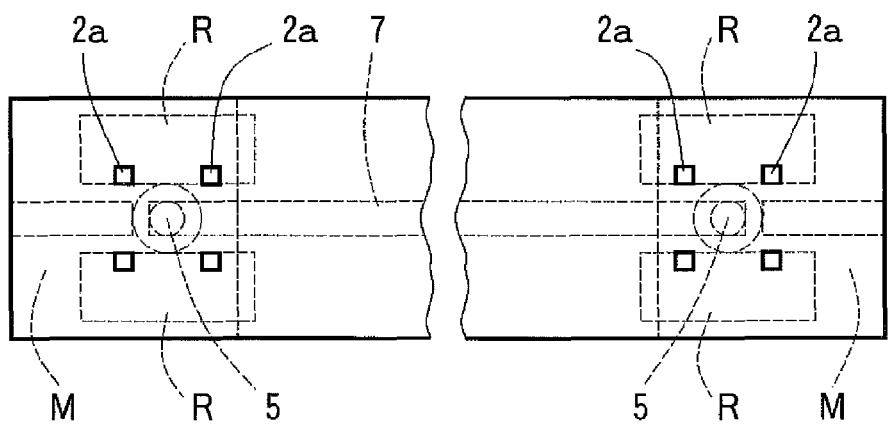
FIG. 1B is a plan view schematically showing the opto-electric hybrid board.
Figure 1C:
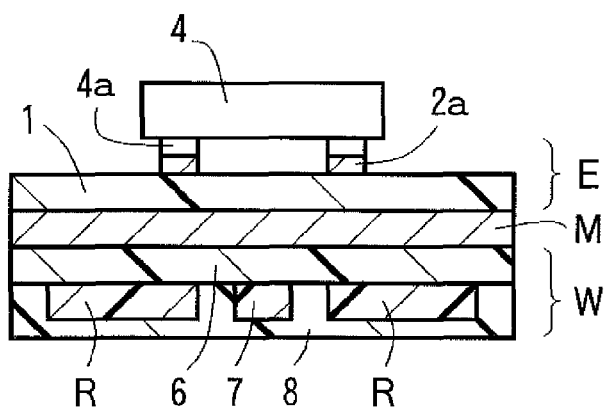
FIG. 1C is an enlarged view schematically showing a cross section taken along line A-A in FIG. 1A.

FIG. 1A is a longitudinal sectional view schematically showing an opto-electric hybrid board according to a first preferred embodiment. FIG. 1B is a plan view of the opto-electric hybrid board. FIG. 1C is an enlarged view of a cross section (a section taken along line A-A in FIG. 1A) of a portion corresponding to element mounting electrodes 2a. Note that, FIG. 1B only partially shows the structures such as the element mounting electrodes 2a, a metal-made reinforcing layer M, a resin-made reinforcing layer R, and a core 7 and the like, in order to clarify the arrangement of the element mounting electrodes 2a, the metal-made reinforcing layer M and the resin-made reinforcing layer R of the opto-electric hybrid board. The opto-electric hybrid board according to the present embodiment is strip-shaped as a whole, and includes: an electric circuit board E including a translucent insulative layer 1 and an electrical interconnect line 2 provided with element mounting electrodes 2a, the electrical interconnect line 2 being formed on the front surface of the insulative layer 1; an optical element 4 being in contact with the element mounting electrodes 2a of the electric circuit board E, the optical element 4 being bonded to the element mounting electrodes 2a using contact frictional heat generated between the optical element 4 and the element mounting electrodes 2a; and an optical waveguide W having its first cladding layer (under cladding layer) 6 formed so as to be in contact with the back surface of the insulative layer 1 of the electric circuit board E. Between the insulative layer 1 and the first cladding layer 6, a metal-made reinforcing layer M is provided at each of opposite longitudinal end portions, which correspond to the element mounting electrodes 2a. Further, in the surface of the first cladding layer 6 on the side opposite to the insulative layer 1 (i.e., the surface where the core 7 is formed), the opposite longitudinal end portions corresponding to the element mounting electrodes 2a are each provided with a resin-made reinforcing layer R. The resin-made reinforcing layer R is set to be greater than the first cladding layer 6 in the storage modulus at the temperature of the opto-electric hybrid board when the element is being mounted. Further, in the present preferred embodiment, the core 7 is made of the material identical to that of the resin-made reinforcing layer R.

Note that, in the present preferred embodiment, at each longitudinal end portions of the strip-shaped opto-electric hybrid board, four element mounting electrodes 2a are arranged at the four corners of a virtual rectangle. The center of the virtual rectangle serves as an optical path 5 between the optical element 4 mounted on the element mounting electrodes 2a and a reflecting surface (45 degree-inclined surface) 7a of the core 7. The metal-made reinforcing layer M is formed at each of the opposite longitudinal end portions of the opto-electric hybrid board so as to exclude the optical path 5 (i.e., so as to surround the optical path 5). Further, the metal-made reinforcing layer M is in contact with a grounding electrode 2b of the electrical interconnect line 2.

Further, in the present preferred embodiment, one core 7 is formed from one end to the other end extending in the longitudinal direction and at the center in the width direction of the band-shaped opto-electric hybrid board. The resin-made reinforcing layer R is formed at each of the opposite sides of the core 7 with an interval from the core 7 near the element mounting electrodes 2a, and at each of the opposite longitudinal end portions of the opto-electric hybrid board.

The metal-made reinforcing layer M and the resin-made reinforcing layer R are not formed across the entire opto-electric hybrid board, but only at the portions corresponding to the element mounting electrodes 2a in a limited manner. Accordingly, with the majority of the opto-electric hybrid board with no metal-made reinforcing layer M and resin-made reinforcing layer R, excellent flexibility is exhibited and a reduction in weight can be achieved.

Further, since the metal-made reinforcing layer M and the resin-made reinforcing layer R are provided at the portions corresponding to the element mounting electrodes 2a, the opto-electric hybrid board can be reduced in thickness. Furthermore, the electric circuit board E and the optical waveguide W can be prevented from being deformed under the pressure load occurring when the optical element 4 is being mounted on the element mounting electrodes 2a. Thus, excellent mounting workability with the optical element 4 is exhibited.

Furthermore, since the resin-made reinforcing layer R is formed on the core formed surface of the first cladding layer 6, and the resin-made reinforcing layer R is set to be greater than the first cladding layer 6 in the storage modulus at the temperature of the opto-electric hybrid board when the element is being mounted, the optical waveguide can be prevented from being deformed by ultrasonic vibrations when the optical element 4 is being mounted on the element mounting electrodes 2a by the ultrasonic mounting process. Accordingly, the element mounting electrodes 2a and electrodes 4a of the optical element 4 can be fully rubbed against each other, whereby full frictional heat can be generated. As a result, the electrodes 2a and 4a can be properly fused, to be properly joined to each other.

Further, since the metal-made reinforcing layer M is formed to surround the optical path 5, it functions to prevent the moisture, which degrades light propagation efficiency, from infiltrating from the side of the first cladding layer 6 into the optical path 5. That is, with the opto-electric hybrid board, flexibility and a reduction both in weight and thickness are achieved. Furthermore, simultaneously, the light propagation efficiency is prevented from being degraded by the moisture infiltrating into the optical path 5.

In more detail, the electric circuit board E includes the translucent insulative layer 1 and the electrical interconnect line 2 formed on the front surface of the insulative layer 1, as described above. Further, at the opposite longitudinal end portions of the opto-electric hybrid board, the element mounting electrodes 2*a* are formed as being uncovered on the front surface of the insulative layer 1, and the grounding electrode 2*b* is formed as being uncovered, penetrating through the insulative layer 1 to be brought into contact with the metal-made reinforcing layer M on the back surface of the insulative layer 1. The element mounting electrodes 2*a* and the grounding electrode 2*b* are part of the electrical interconnect line 2. The remainder of the electrical interconnect line 2 is covered by a coverlay 3, and is insulated and protected.

As described above, the metal-made reinforcing layer M is formed at the portion at each end portion of the opto-electric hybrid board between the insulative layer 1 and the first cladding layer 6, so as to correspond to the four element mounting electrodes 2*a*. For the purpose of reducing the thickness of the opto-electric hybrid board and suppressing deformation of the electric circuit board E and the optical waveguide W which may occur when the optical element 4 is mounted on the element mounting electrodes 2*a*, the thickness of the metal-made reinforcing layer M is set to fall within the range of 10 µm to 30 µm. Though the thickness of the metal-made reinforcing layer M being less than 10 µm can achieve a further reduction in thickness, it tends to be difficult to suppress the deformation associated with the mounting work of the optical element 4. Hence, a reduction in strength of the mounted product or in the positional precision of the optical element 4 may occur. Conversely, though the thickness of the metal-made reinforcing layer M being greater than 30 µm can fully suppress the deformation, since the first cladding layer 6 is formed to cover the metal-made reinforcing layer M, the first cladding layer 6 becomes thick. Hence, a reduction in flexibility of the opto-electric hybrid board may occur.

The optical waveguide W includes, the first cladding layer (under cladding layer) 6, the core 7 and the resin-made reinforcing layer R formed on the front surface of the first cladding layer 6 in a predetermined pattern, and a second cladding layer (over cladding layer) 8 formed on the front surface of the first cladding layer 6 so as to cover the core 7 and the resin-made reinforcing layer R. The first cladding layer 6 is formed to cover the metal-made reinforcing layer M and to infill and bury the optical path 5. The back surface (the surface opposite to the surface where the core 7 is formed) of the first cladding layer 6 is in contact with the insulative layer 1 of the electric circuit board E. Further, at each of the opposite longitudinal end portions, the portion of the core 7 corresponding to the optical path 5 is formed to be an inclined surface of 45 degrees relative to the longitudinal direction of the core 7. The inclined surface serves as a reflecting surface 7*a* that allows a light beam to propagate between the optical element 4 mounted on the element mounting electrodes 2*a* and the core 7. That is, at the reflecting surface 7*a*, the refractive index of the core 7 is greater than that of air outside the reflecting surface 7*a*. Therefore, when a light beam from a light-emitting element (optical element 4) or a light beam propagated through the core 7 impinges upon the reflecting surface 7*a*, a majority of the light beam is reflected to change the optical path thereof by 90 degrees.

Next, a method of manufacturing the opto-electric hybrid board will be described (see FIGS. 2A to 2D, FIGS. 3A to 3C, and FIGS. 4A and 4B).

Firstly, a metal sheet member (metal layer) $M_1$ (see FIG. 2A) for forming the metal-made reinforcing layer M is prepared. Exemplary metal materials for the metal sheet member $M_1$ (metal-made reinforcing layer M) include stainless steel, titanium, and various alloys. Further, the thickness of the metal sheet member $M_1$ is set to fall within the range of 10 µm to 30 µm, similarly to the thickness of the metal-made reinforcing layer M.

Figure 2A:
FIGS. 2A to 2D are illustrations schematically showing the steps of producing an electric circuit board and producing a metal-made reinforcing layer in a method of manufacturing the opto-electric hybrid board.

Next, as shown in FIG. 2A, a photosensitive insulating resin including polyimide resin or the like is applied to the front surface of the metal sheet member $M_1$, and the insulative layer 1 having a predetermined pattern is formed by the photolithographic process. In the present preferred embodiment, for the purpose of forming the grounding electrode 2*b* to be in contact with the metal-made reinforcing layer M (metal sheet member $M_1$), a hole 1*a* for uncovering the portion of the front surface of the metal sheet member $M_1$ corresponding to the grounding electrode 2*b* is formed at each of the opposite longitudinal end portions. Note that the thickness of the insulative layer 1 is set to fall within the range of 3 µm to 30 µm.

Figure 2B:
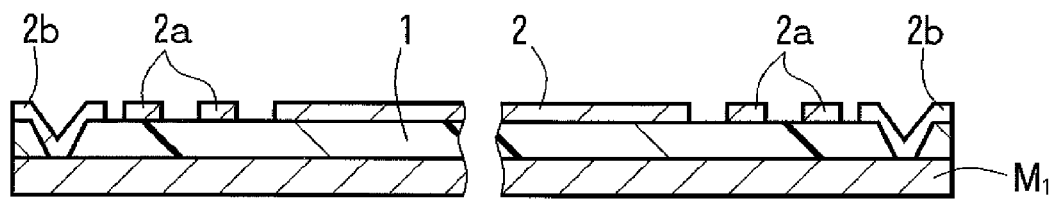

Next, as shown in FIG. 2B, the electrical interconnect line (including the element mounting electrodes 2*a* and the grounding electrodes 2*b*) 2 is formed by a semi-additive process, for example. The semi-additive process is performed as follows. Firstly, a metal film (not shown) made of copper, chromium or the like is formed on the front surface of the insulative layer 1 by sputtering, electroless plating or the like. This metal film serves as a seed layer (a layer serving as a basis material for the formation of an electroplated layer) for the subsequent electroplating process. Then, a photosensitive resist (not shown) is laminated onto each of the opposite surfaces of a laminate made up of the metal sheet member $M_1$, the insulative layer 1 and the seed layer. Thereafter, the photolithographic process is performed to form a hole in the pattern of the electrical interconnect line 2 at the photosensitive resist on the side where the seed layer is formed, such that the surface portion of the seed layer is uncovered at the bottom of the hole. Next, electroplating is performed to form an electroplated layer made of copper or the like in a stacked manner on the surface portion of the seed layer uncovered at the bottom of the hole. Then, the photosensitive resist is stripped away using an aqueous sodium hydroxide solution or the like. Thereafter, the seed layer with no electroplated layer is removed by soft etching. The laminate portion made up of the remaining seed layer and the electroplated layer is the electrical interconnect line 2. Note that the thickness of the electrical interconnect line 2 is set to fall within the range of 5 µm to 35 µm.

Figure 2C:
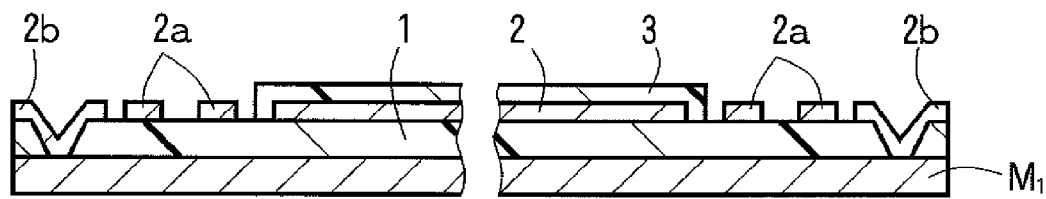

An electroless plated layer (not shown) made of nickel or the like is formed on the front surface of the electrical interconnect line (including the element mounting electrodes 2*a* and the grounding electrodes 2*b*) 2. Thereafter, as shown in FIG. 2C, a photosensitive insulating resin being polyimide resin or the like is applied to the electrical interconnect line 2 excluding the element mounting electrodes 2*a* and the grounding electrodes 2*b*, to form the coverlay 3 by the photolithographic process.

Then, the electroless plated layer (not shown) formed on the element mounting electrodes 2*a* and the grounding electrodes 2*b* is removed by etching. Thereafter, an electroplated layer (not shown) made of gold, nickel or the like is formed at each place where the electroless plated layer has been removed. In this manner, the electric circuit board E is formed on the front surface of the metal sheet member $M_1$.

Next, a photosensitive resist (not shown) is laminated to each of the opposite faces of a laminate made up of the metal sheet member $M_1$ and the electric circuit board E. Thereafter, the photosensitive resist on the back surface side (the surface on the side opposite to the electric circuit board E) of the metal sheet member $M_1$ excluding the portion corresponding to the metal-made reinforcing layer M is removed by the photolithographic process, such that the back surface portion of the metal sheet member $M_1$ is uncovered at the bottom of the removed portion (the top side in the drawing).

Figure 2D:
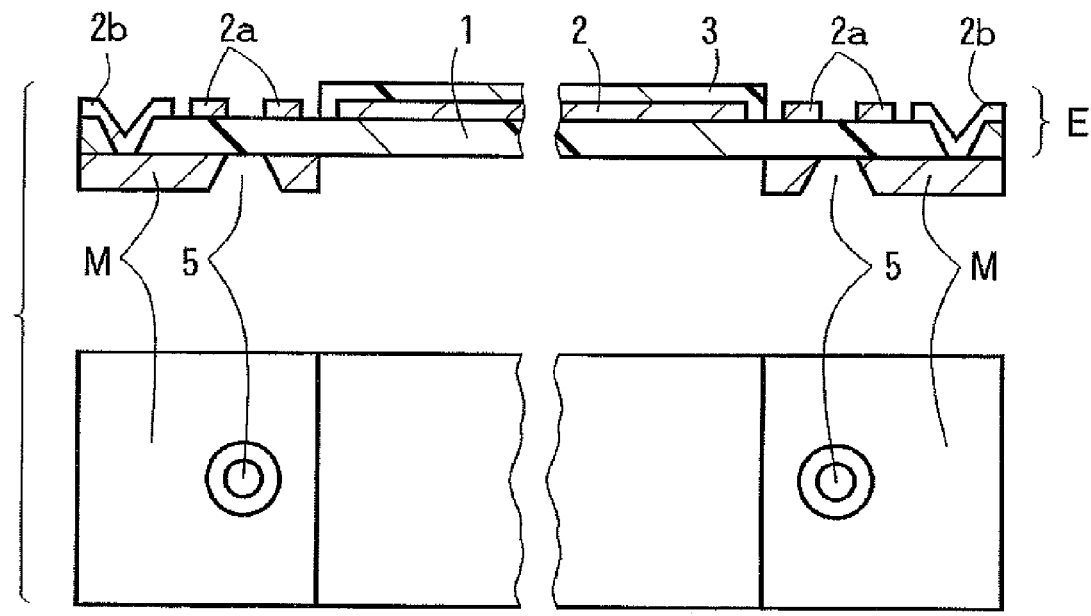

Then, as shown in FIG. 2D (the drawing on the top side is a longitudinal sectional view with the drawing on the bottom side being a bottom view), the portions of the metal sheet member $M_1$ uncovered at the removed portion are removed by etching using a suitable aqueous etching solution for the metal material of the metal sheet member $M_1$ (for example, an aqueous ferric chloride solution for a stainless steel layer), to form the metal-made reinforcing layer M, with the insulative layer 1 being uncovered at the bottom (the top side in the drawing) of the removed portions. Thereafter, the photosensitive resist is stripped away using an aqueous sodium hydroxide solution or the like.

Figure 3A:
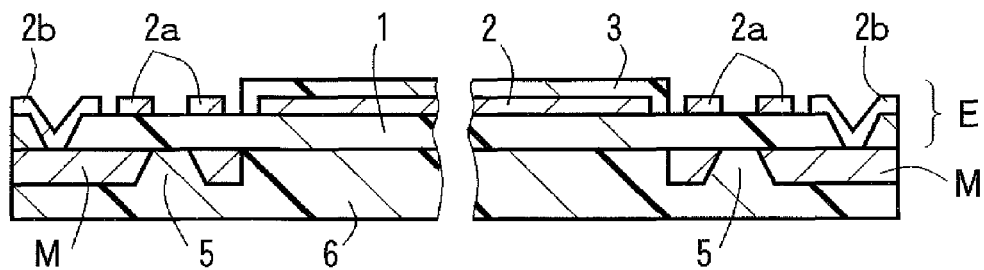
FIGS. 3A to 3C are illustrations schematically showing the steps of producing an optical waveguide in the method of manufacturing the opto-electric hybrid board.

In order to form the optical waveguide W (see FIG. 4A) on the back surface (the bottom side in the drawing) of the electric circuit board E, firstly, as shown in FIG. 3A, a photosensitive resin such as photosensitive epoxy resin being the material of the first cladding layer (under cladding layer) 6 is applied to the back surface of the insulative layer 1 so as to cover the metal-made reinforcing layer M. Thereafter, the applied layer is exposed to irradiation light. The applied layer thus heated cures, to form the first cladding layer 6. The thickness of the first cladding layer 6 (the thickness from the metal-made reinforcing layer M) is set to fall within the range of 3 μm to 30 μm. Note that, the back surface of the metal-made reinforcing layer M is on the top side when the optical waveguide W is being formed (i.e., when the above-described first cladding layer 6, the core 7 whose description will follow and the second cladding layer (over cladding layer) 8 whose description will follow are being formed).

Figure 3B:
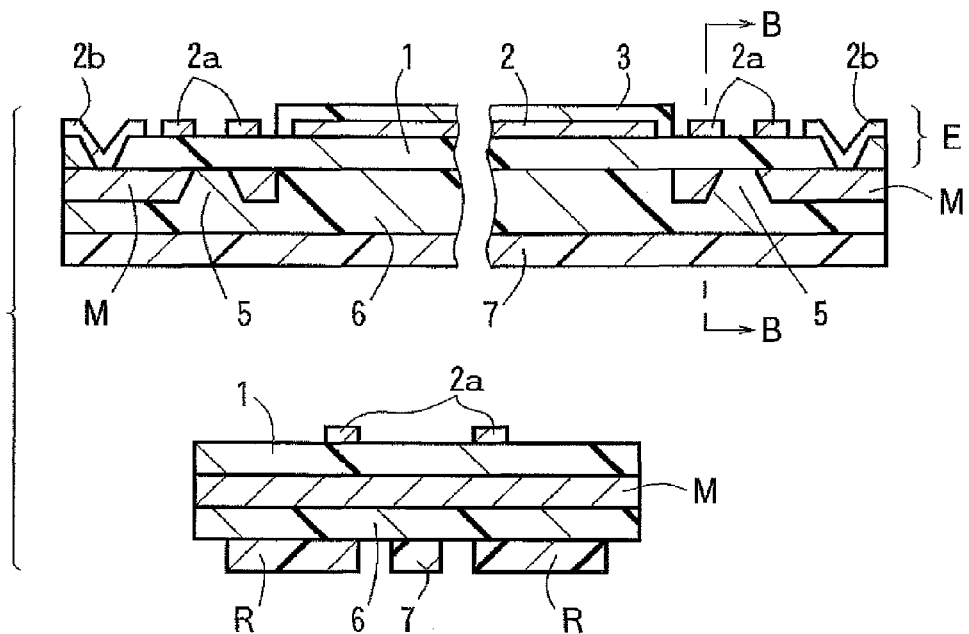

Then, as shown in FIG. 3B (the illustration on the top side is a longitudinal sectional view with the illustration on the bottom side being a cross-sectional view taken along line B-B in the top side drawing), the core 7 and the resin-made reinforcing layer R of a predetermined pattern are simultaneously formed on the front surface (the bottom side in the drawing) of the first cladding layer 6 by the photolithographic process. The thickness of the core 7 and the resin-made reinforcing layer R is set to fall within the range of 20 μm to 100 μm. The width of the core 7 is set to fall within the range of 20 μm to 100 μm. The clearance between the core 7 and the resin-made reinforcing layer R are set to fall within the range of 5 μm to 100 μm.

An exemplary material for the core 7 and the resin-made reinforcing layer R is a photosensitive resin similar to that for the first cladding layer 6. Here, what is used is the material that exhibits greater refractive index than the above-described first cladding layer 6 and the second cladding layer 8, whose description will follow (see FIG. 3C), in the state where the core 7 and the resin-made reinforcing layer R are formed. Further, with the material, the core 7 and the resin-made reinforcing layer R become greater than the first cladding layer 6 in the storage modulus at the temperature of the opto-electric hybrid board when the element is being mounted. The refractive index and the storage modulus can be adjusted by, for example, modifying the selection of the types of the materials of the first cladding layer 6, the core 7 and the second cladding layer 8 or the composition ratio thereof.

The higher storage modulus is better in view of element mounting workability, whereas the smaller storage modulus is better in view of flexibility in use. Accordingly, it is preferable that the storage modulus of the core 7 and the resin-made reinforcing layer R is set to fall within the range of 0.5 GPa to 2.0 GPa whether it is at the temperature of the opto-electric hybrid board when the element is being mounted or at the room temperature)(25 C.°) in use, and that the storage modulus of the first and second cladding layers 6 and 8 is set to fall within the range of 0.3 GPa to 1.5 GPa.

Figure 3C:
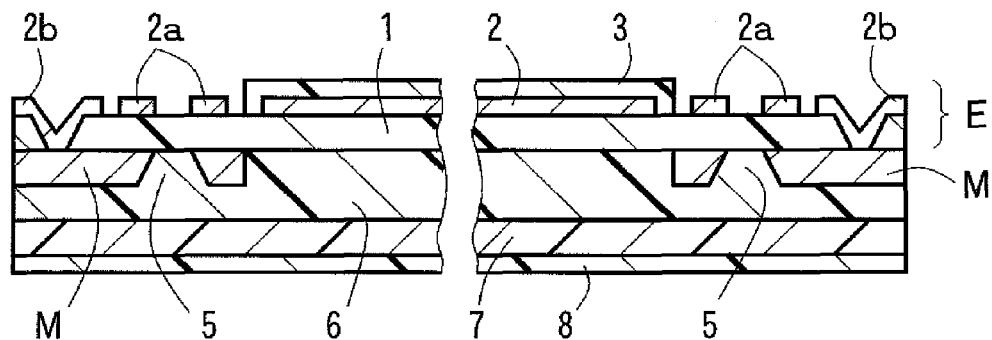

Next, as shown in FIG. 3C, the second cladding layer 8 is formed on the front surface (the bottom side in the drawing) of the first cladding layer 6 by the photolithographic process so as to cover the core 7 and the resin-made reinforcing layer R. The thickness (the thickness from the core 7) of the second cladding layer 8 is set to fall within the range of 3 μm to 50 μm. An exemplary material of the second cladding layer 8 is a photosensitive resin similar to that of the first cladding layer 6.

Figure 4A:
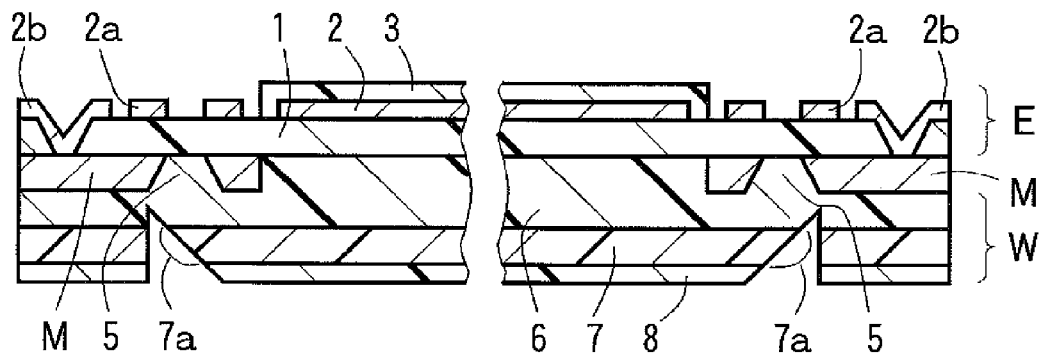
FIG. 4A is an illustration schematically showing a step of producing the optical waveguide following FIGS. 3A to 3C.

Then, as shown in FIG. 4A, portions (opposite end portions) of the optical waveguide W corresponding to the optical path 5 (positioned at a lower part in the drawing) are formed into inclined surfaces inclined by 45 degrees relative to the longitudinal direction of the core 7, by laser beam machining, cutting work through use of a rotary blade whose tool angle is 45 degrees, or the like. Thus, such portions of the core 7 positioned at the inclined surfaces each function as the reflecting surface 7*a*. In this manner, the optical waveguide W is formed on the back surface of the electric circuit board E.

Figure 4B:
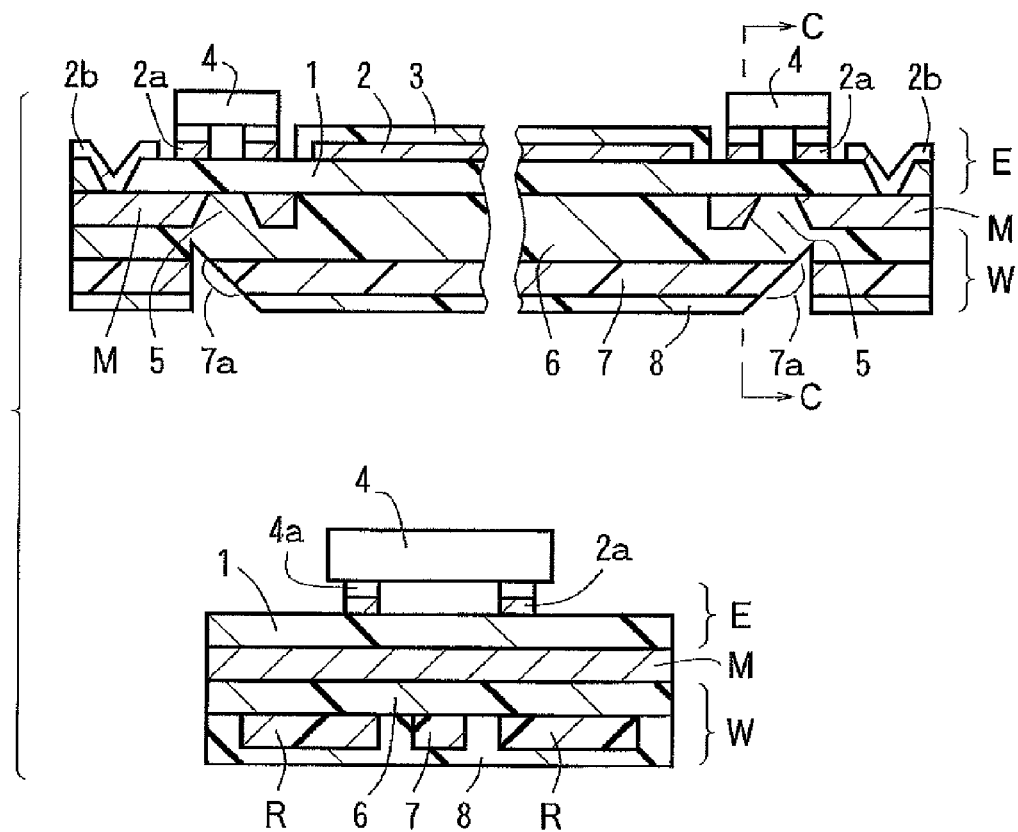
FIG. 4B is an illustration schematically showing a step of mounting an optical element in the method of manufacturing the opto-electric hybrid board.

Thereafter, as shown in FIG. 4B (the illustration on the top side is a longitudinal sectional view with the illustration on the bottom side being a cross-sectional view taken along line C-C in the top side illustration), a laminate made up of the electric circuit board, the metal layer and the optical waveguide is placed on a stage (not shown) of an ultrasonic mounting machine, and the optical element 4 is mounted on the element mounting electrodes 2*a* by the ultrasonic mounting process. At this time, though a pressure load is applied to the electric circuit board E and the optical waveguide W, the metal-made reinforcing layer M can prevent the electric circuit board E and the optical waveguide W from being deformed by the pressure load. Further, though ultrasonic vibrations are applied to the optical waveguide W, the resin-made reinforcing layer R can prevent the optical waveguide W from being deformed by ultrasonic vibrations. Accordingly, the element mounting electrodes 2*a* and the electrodes 4*a* of the optical element 4 can be fully rubbed against each other, whereby full frictional heat can be generated. As a result, the electrodes 2*a* and 4*a* can be properly fused and joined to each other. In this manner, the opto-electric hybrid board shown in FIGS. 1A to 1C is obtained.

FIGS. 5 to 10 are plan views schematically showing one end portions of opto-electric hybrid boards according to second to seventh preferred embodiments, respectively. FIGS. 5 to 10 correspond to the left part of FIG. 1B. FIGS. 5 to 10 only partially show the structures such as the element mounting electrodes 2*a*, the resin-made reinforcing layer R and the core 7 and the like, in order to clarify the arrangement of the element mounting electrodes 2*a* and the resin-made reinforcing layer R. Note that, since the metal-made reinforcing layer M is structured identically as shown in FIG. 1B, it is not illustrated. The metal-made reinforcing layer M according to each of the second to seventh preferred embodiments achieves functions and effects similar to those exhibited by the metal-made reinforcing layer M according to the first preferred embodiment.

Figure 5:
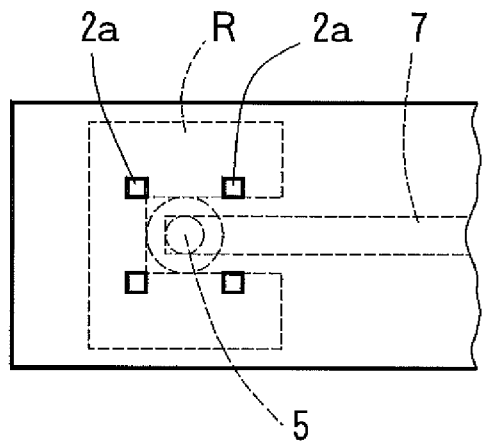
FIG. 5 is a plan view schematically showing an opto-electric hybrid board according to a second preferred embodiment.

In the second preferred embodiment shown in FIG. 5, in the structure of the first preferred embodiment shown in FIGS. 1A to 1C, the core 7 is formed to extend just up to the portion corresponding to the optical path 5. The resin-made reinforcing layer R located on either side of the core 7 is formed to be continuous across that portion where the core 7 is not formed.

Figure 6:
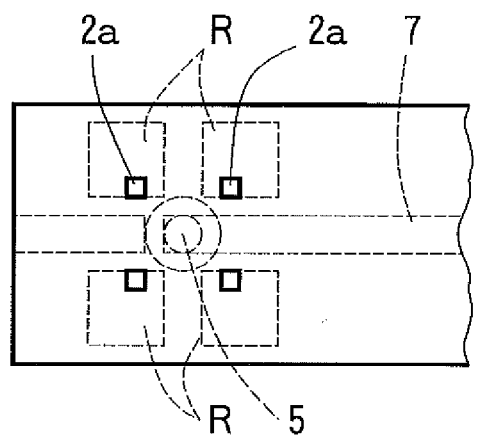
FIG. 6 is a plan view schematically showing an opto-electric hybrid board according to a third preferred embodiment.

In the third preferred embodiment shown in FIG. 6, in the first preferred embodiment shown in FIGS. 1A to 1C, for each portion corresponding to each element mounting electrode 2a, the resin-made reinforcing layer R is formed.

Figure 7:
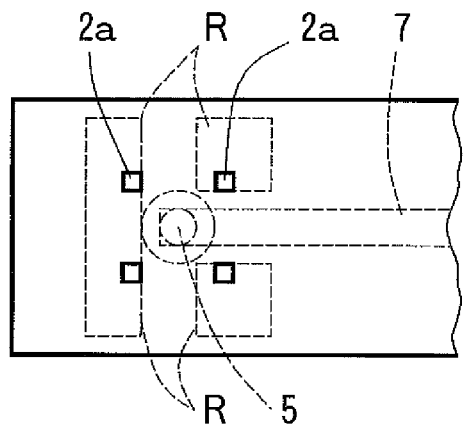
FIG. 7 is a plan view schematically showing an opto-electric hybrid board according to a fourth preferred embodiment.

In the fourth preferred embodiment shown in FIG. 7, in the structure of the third preferred embodiment shown in FIG. 6, the core 7 is formed to extend just up to the portion corresponding to the optical path 5. The resin-made reinforcing layer R located on either side of the core 7 is formed to be continuous across that portion where the core 7 is not formed.

Figure 8:
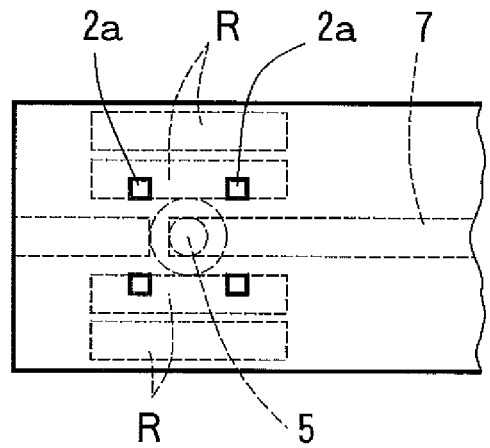
FIG. 8 is a plan view schematically showing an opto-electric hybrid board according to a fifth preferred embodiment.
Figure 9:
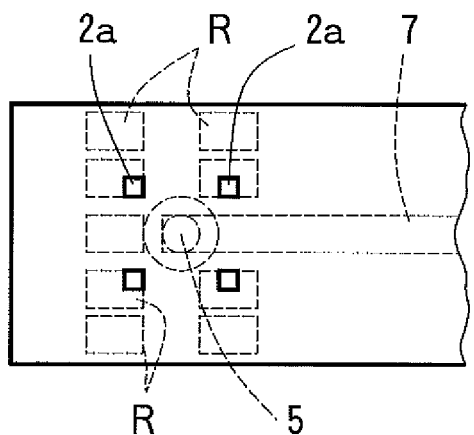
FIG. 9 is a plan view schematically showing an opto-electric hybrid board according to a sixth preferred embodiment.

In the fifth preferred embodiment shown in FIG. 8, in the structure of the first preferred embodiment shown in FIGS. 1A to 1C, the resin-made reinforcing layer R is formed as being divided into pieces aligned in the width direction of the opto-electric hybrid board.

In the second preferred embodiment shown in FIG. 5, in the structure of the first preferred embodiment shown in FIGS. 1A to 1C, the resin-made reinforcing layer R is formed as being divided in the width direction and in the longitudinal direction of the opto-electric hybrid board.

Figure 10:
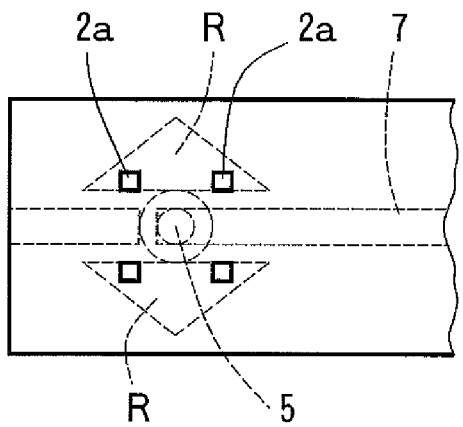
FIG. 10 is a plan view schematically showing an opto-electric hybrid board according to a seventh preferred embodiment.

In the seventh preferred embodiment shown in FIG. 10, in the first preferred embodiment shown in FIGS. 1A to 1C, the resin-made reinforcing layer R is formed in a triangular shape that gradually narrows toward the side edge portion in the width direction of the opto-electric hybrid board.

Figure 11:
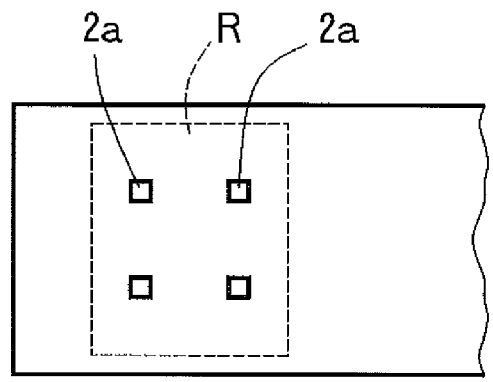
FIG. 11 is a plan view schematically showing an opto-electric hybrid board according to an eighth preferred embodiment.
Figure 12:
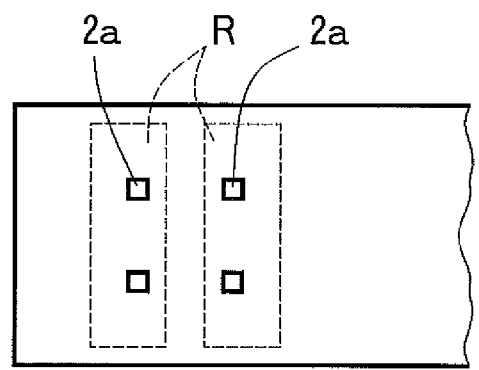
FIG. 12 is a plan view schematically showing an opto-electric hybrid board according to a ninth preferred embodiment.
Figure 13:
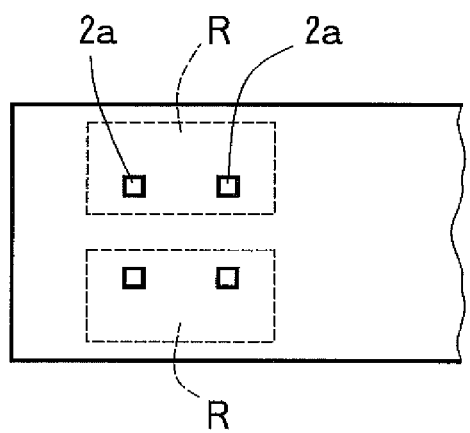
FIG. 13 is a plan view schematically showing an opto-electric hybrid board according to a tenth preferred embodiment.

FIGS. 11 to 13 are plan views schematically showing one end portions of opto-electric hybrid boards according to the eighth to tenth preferred embodiments, respectively. The structure of each of the eighth to tenth preferred embodiments does not include the core (see FIGS. 5 to 10) at the portion corresponding to the element mounting portion. FIGS. 11 to 13 only partially show the structures such as the element mounting electrodes 2a, the resin-made reinforcing layer R and the like, in order to clarify the arrangement of the element mounting electrodes 2a and the resin-made reinforcing layer R. The eighth to tenth preferred embodiments achieve functions and effects similar to those described in the first preferred embodiment.

In the eighth preferred embodiment shown in FIG. 11, the resin-made reinforcing layer R is entirely and continuously formed across the portion corresponding to the element mounting portion.

In the ninth preferred embodiment shown in FIG. 12, in the structure of the eighth preferred embodiment shown in FIG. 11, the resin-made reinforcing layer R is formed as being divided into pieces each elongated in the width direction of the opto-electric hybrid board.

In the tenth preferred embodiment shown in FIG. 13, in the structure of the eighth preferred embodiment shown in FIG. 11, the resin-made reinforcing layer R is formed as being divided into pieces each elongated in the longitudinal direction of the opto-electric hybrid board.

FIGS. 14 to 17 are cross sectional views schematically showing one end portions of opto-electric hybrid boards according to eleventh to fourteenth preferred embodiments, respectively (corresponding to FIG. 1C). The eleventh to fourteenth preferred embodiments achieve functions and effects similar to those described in the first preferred embodiment.

Figure 14:
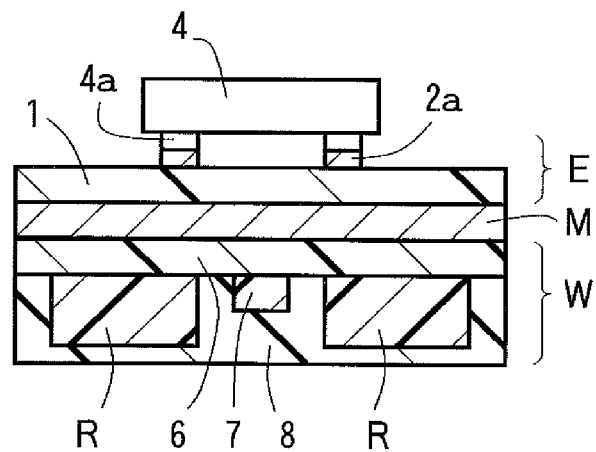
FIG. 14 is a cross sectional view schematically showing an opto-electric hybrid board according to an eleventh preferred embodiment.

In the eleventh preferred embodiment shown in FIG. 14, in the structure of the first preferred embodiment shown in FIGS. 1A to 1C, the resin-made reinforcing layer R is formed to be thicker than the core 7. Accordingly, despite an increase in the thickness of the optical waveguide W, owing to a similar increase in the thickness of the resin-made reinforcing layer R, excellent mounting workability in the ultrasonic mounting process is exhibited. Note that, conversely, the resin-made reinforcing layer R may be formed to be thinner than the core 7 (not shown).

Figure 15:
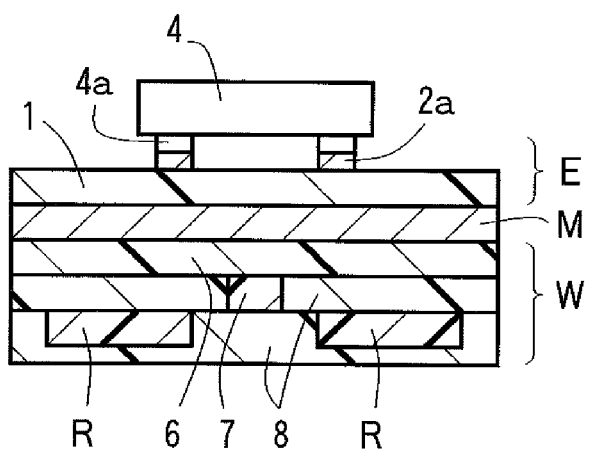
FIG. 15 is a cross sectional view schematically showing an opto-electric hybrid board according to a twelfth preferred embodiment.

In the twelfth preferred embodiment shown in FIG. 15, in the structure of the first preferred embodiment shown in FIGS. 1A to 1C, the resin-made reinforcing layer R is structured at the layer being different from the core 7. Accordingly, despite an increase in the thickness of the optical waveguide W, owing to the resin-made reinforcing layer R, excellent mounting workability in the ultrasonic mounting process is exhibited.

Figure 16:
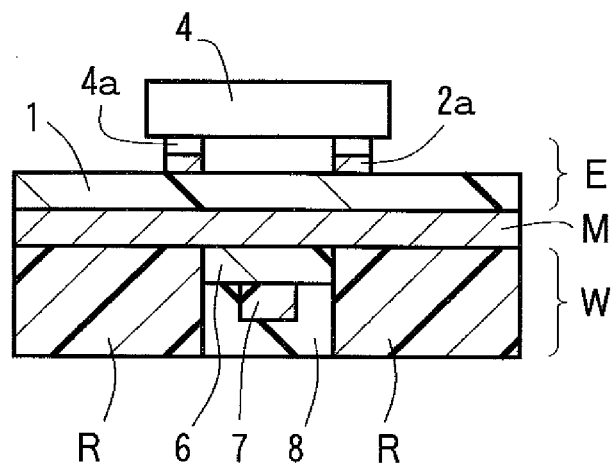
FIG. 16 is a cross sectional view schematically showing an opto-electric hybrid board according to a thirteenth preferred embodiment.

In the thirteenth preferred embodiment shown in FIG. 16, in the structure of the first preferred embodiment shown in FIGS. 1A to 1C, the first and second cladding layers 6 and 8 (see FIG. 1C) are not formed at the portion where the resin-made reinforcing layer R is formed. Accordingly, the thickness of the resin-made reinforcing layer R increases by the thickness of the first and second cladding layers 6 and 8, whereby excellent mounting workability in the ultrasonic mounting process is exhibited.

Figure 17:
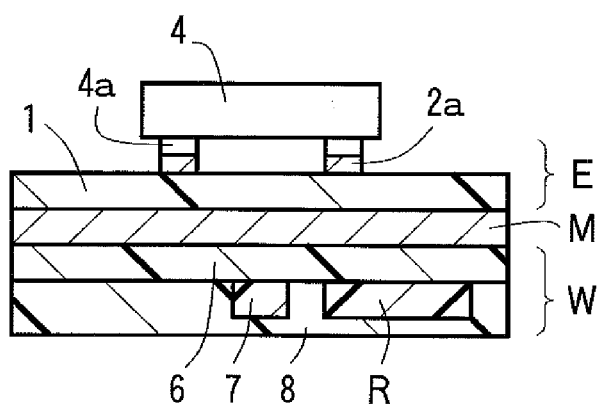
FIG. 17 is a cross sectional view schematically showing an opto-electric hybrid board according to a fourteenth preferred embodiment.
Figure 18:
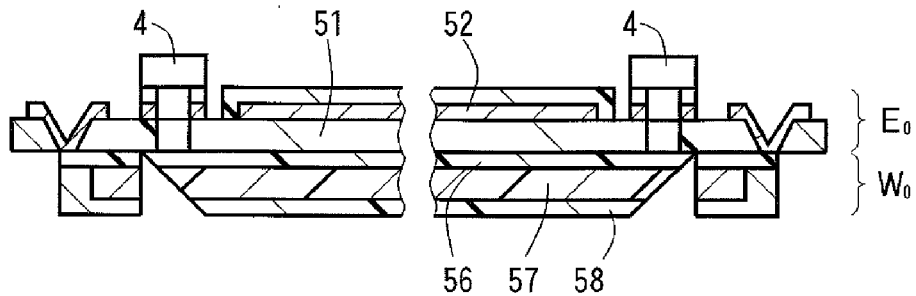
FIG. 18 is a longitudinal sectional view schematically showing a conventional opto-electric hybrid board.
Figure 19:
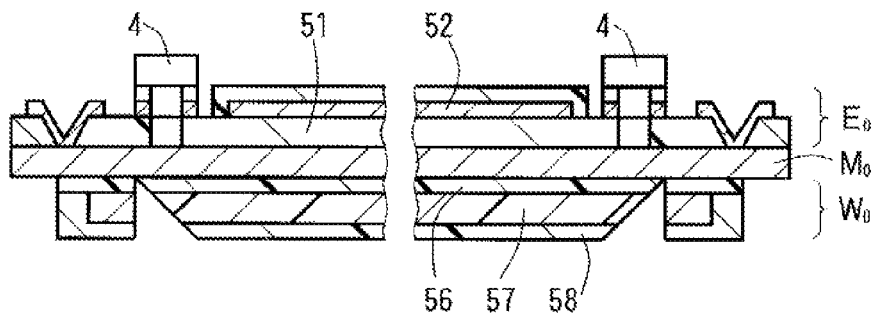
FIG. 19 is a longitudinal sectional view schematically showing another conventional opto-electric hybrid board.
Figure 20:
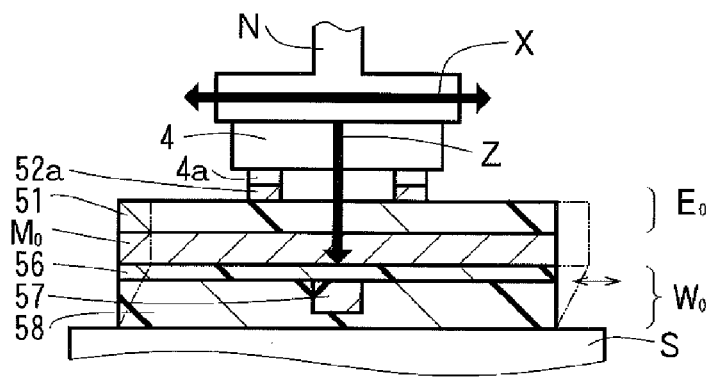
FIG. 20 is an illustration schematically showing a step of mounting an optical element in a manufacturing method of the conventional opto-electric hybrid board.

In the fourteenth preferred embodiment shown in FIG. 17, in the structure of the first preferred embodiment shown in FIGS. 1A to 1C, the resin-made reinforcing layer R is formed at only one side in the width direction of the opto-electric hybrid board. Accordingly, though the mounting workability in the ultrasonic mounting process is inferior to the first preferred embodiment, it is at the sufficient level owing to the resin-made reinforcing layer R.

The first and the eleventh to fourteenth preferred embodiments may be practiced in any combination.

Here, the ultrasonic wave in the ultrasonic mounting process oscillates linearly. While the resin-made reinforcing layer R can be formed in various shapes as in the preferred embodiments described above, in order to secure tolerance for ultrasonic vibrations in mounting the element and an improvement in the mounting workability, it is preferable that the resin-made reinforcing layer R is formed as being elongated in the vibrating direction of the ultrasonic waves.

In the preferred embodiments described above, the resin-made reinforcing layer R is made of the same material as that of the core 7 and the resin-made reinforcing layer R is simultaneously formed with the core 7. However, they may be made of different materials. In this case, the resin-made reinforcing layer R is set to be higher than the first cladding layer in the storage modulus at the temperature of the opto-electric hybrid board when the element is being mounted. Furthermore, the storage modulus of the resin-made reinforcing layer R at that temperature is set to be 0.5 GPa or more. The formation of the resin-made reinforcing layer R may precede that of the core 7, and vice versa.

In the preferred embodiments described above, the optical element 4 is mounted on the element mounting electrodes 2a. However, the preferred embodiments can be similarly practiced when any element other than the optical element 4, such as an IC element, e.g., a VCSEL driver, a transimpedance amplifier or the like is to be mounted on the element mounting electrodes 2a.

Further, though four electrodes 4a are present per element such as the optical element 4 in the preferred embodiments described above, more than four electrodes 4a may be present.

Still further, though one core 7 is present in the preferred embodiments described above, two or more cores may be formed.

Further, though the first and second cladding layers 6 and 8 are not patterned in the preferred embodiments described above, they may be patterned by the photolithographic process or the like.

Next, a description will be given of Example in conjunction with Comparative Example. Note that the present invention is not limited to Example.

EXAMPLES

Example

The opto-electric hybrid board according to the first preferred embodiment was employed as Example. Further, the length of the opto-electric hybrid board was set to 100 mm; the width of the opto-electric hybrid board was set to 7 mm; the thickness of the insulative layer was set to 5 μm; the thickness of the metal-made reinforcing layer was set to 20 μm; the thickness of the first cladding layer (the thickness from the metal-made reinforcing layer) was set to 20 μm; the thickness of the core was set to 50 μm; the width of the core was set to 50 μm; the thickness of the resin-made reinforcing layer was set to 50 μm; and the thickness of the second cladding layer (the thickness from the core) was set to 15 μm.

<First and Second Cladding Layers>

Here, the material of the first and second cladding layers was prepared by mixing modified aliphatic epoxy resin (EPICLON EXA-4816, available from DIC Corporation) by 50 parts by weight, bifunctional alicyclic epoxy resin (CELLOXIDE 2021P, available from Daicel Corporation) by 30 parts by weight, polycarbonatediol (PLACCEL CD205PL, available from Daicel Corporation) by 20 parts by weight, photoacid generator (SP170, available from ADEKA CORPORATION) 2 parts by weight, and ethyl lactate (available from Musashino Chemical Laboratory, Ltd.) 5 parts by weight. The storage modulus of the formed first second cladding layers was 1.2 GPa at 25 C.° and 0.7 GPa at the temperature of the opto-electric hybrid board when the element is being mounted)(50 C.°).

<Core and Resin-Made Reinforcing Layer>

Further, the material of the core and the resin-made reinforcing layer was prepared by mixing o-cresol novolac glycidyl ether (YDCN-700-10, available from NIPPON STEEL & SUMIKIN CHEMICAL CO., LTD.) by 50 parts by weight, bisphenoxy ethanol fluorene diglycidyl ether (OGSOL EG, available from Osaka Gas Chemicals Co., Ltd.) by 50 parts by weight, photoacid generator (SP170, available from ADEKA CORPORATION) by 1 part by weight, ethyl lactate (Musashino Chemical Laboratory, Ltd.) by 50 parts by weight. The storage modulus of the formed core and the resin-made reinforcing layer was 1.2 GPa at 25 C.° and 1.1 GPa at the temperature of the opto-electric hybrid board when the element is being bound)(50 C.°).

Comparative Example

An opto-electric hybrid board according to Example with no resin-made reinforcing layer was employed as Comparative Example.

<Mounting Workability with Optical Element>

On the element mounting electrodes of each of the opto-electric hybrid board according to Example and according to Comparative Example, a light receiving element (photodiode KPDG006HA1, available from Kyosemi Corporation) was mounted using the ultrasonic mounting machine Flip Chip Bonder (FCB3, available from Panasonic Factory Solutions Co., Ltd.). The mounting conditions were as follows: element temperature 150 C.°; temperature of the opto-electric hybrid board 50 C.°; pressure load 1.0 N; ultrasonic wave output 3.0 W; and mounting time 0.5 seconds. The die shear strength was measured using a shear strength measuring device Bump Pull Tester (DAGE SERIES 5000, available from Dage Japan Co., Ltd.). As a result, while Example showed 1.1 N, Comparative Example showed 0.8 N.

From the results above, it can be seen that the element is strongly mounted by the ultrasonic mounting process on Example with the resin-made reinforcing layer, as compared to Comparative Example with no resin-made reinforcing layer.

The opto-electric hybrid board and the method of manufacturing the same of the present invention are useful for mounting an optical element by the ultrasonic mounting process.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid board, comprising:
   an electric circuit board including an insulative layer having front and back surfaces, and an element mounting electrode formed at a predetermined position on the front surface of the insulative layer;
   an element being in contact with the element mounting electrode, the element being mounted through use of contact frictional heat generated by being in contact with the element mounting electrode;
   an optical waveguide including a cladding layer and a core patterned on the cladding layer, the electric circuit board and the optical waveguide being stacked together in a state where the cladding layer is in contact with the back surface of the insulative layer;
   a metal-made reinforcing layer formed between the insulative layer and the cladding layer at a portion corresponding to the element mounting electrode; and
   a resin-made reinforcing layer formed at a portion corresponding to the element mounting electrode, in the cladding layer where the core is formed, wherein
   the resin-made reinforcing layer is greater than the cladding layer in storage modulus at a temperature of the opto-electric hybrid board when the element is being mounted.

2. The opto-electric hybrid board according to claim 1, wherein
   the core and the resin-made reinforcing layer are made of an identical photosensitive resin.

3. A method of manufacturing an opto-electric hybrid board, comprising:
   forming an insulative layer on a front surface of a metal layer, thereafter forming an element mounting electrode on a front surface of the insulative layer, thereby forming an electric circuit board on the front surface of the metal layer;

forming a cladding layer on a back surface of the metal layer, thereafter forming a core on the cladding layer, thereby forming an optical waveguide on the back surface of the metal layer; and bringing an element into frictional contact with the element mounting electrode to generate frictional heat, the element being mounted on the element mounting electrode through use of the frictional heat, wherein, for forming the optical waveguide, prior to the forming of the cladding layer, removing the metal layer other than a portion of the metal layer corresponding to the element mounting electrode by etching, thereby forming a remaining portion into a metal-made reinforcing layer;

forming the cladding layer at the portion where the metal layer is removed, with the metal-made reinforcing layer being covered; and forming a resin-made reinforcing layer at a portion corresponding to the element mounting electrode in the cladding layer, wherein the resin-made reinforcing layer is greater than the cladding layer in storage modulus at a temperature of the opto-electric hybrid board when the element is being mounted.

4. The method of manufacturing an opto-electric hybrid board according to claim 3, further comprising forming a photosensitive resin layer on the cladding layer, wherein the resin-made reinforcing layer is formed simultaneously with the core through a photolithographic process from the photosensitive resin layer.

\* \* \* \* \*